(12) United States Patent
Kimball

(10) Patent No.: US 8,116,700 B2
(45) Date of Patent: Feb. 14, 2012

(54) REDUCING COMMON MODE EFFECTS IN AN OUTPUT STAGE

(75) Inventor: Eric Kimball, Austin, TX (US)

(73) Assignee: Javelin Semiconductor, Inc., Austin, TX (US)

( * ) Notice: Subject to any disclaimer, the term of this patent is extended or adjusted under 35 U.S.C. 154(b) by 266 days.

(21) Appl. No.: 12/619,062

(22) Filed: Nov. 16, 2009

(65) Prior Publication Data

US 2011/0117860 A1    May 19, 2011

(51) Int. Cl.
*H04B 1/02* (2006.01)
*H03F 3/68* (2006.01)
*H03F 1/00* (2006.01)

(52) U.S. Cl. ............... 455/103; 330/124 R; 330/195
(58) Field of Classification Search .......... 455/73, 455/91, 103, 127.3; 330/124 R, 195
See application file for complete search history.

(56) References Cited

U.S. PATENT DOCUMENTS

| | | |
|---|---|---|
| 4,580,111 A | 4/1986 | Swanson |
| 4,593,251 A | 6/1986 | Smith |
| 4,680,559 A | 7/1987 | Swanson |
| 5,872,481 A | 2/1999 | Sevic et al. |
| 6,069,525 A | 5/2000 | Sevic et al. |
| 6,731,166 B1 | 5/2004 | Sabouri et al. |
| 6,996,379 B2 | 2/2006 | Khorram |
| 7,095,283 B2 | 8/2006 | Kee et al. |
| 7,129,784 B2 | 10/2006 | Bhatti et al. |
| 7,157,965 B1 | 1/2007 | Kim |
| 7,215,206 B2 | 5/2007 | Dupuis et al. |
| 7,728,661 B2 * | 6/2010 | Bockelman et al. ............ 330/51 |
| 2009/0273397 A1 | 11/2009 | Bockelman et al. |
| 2009/0278609 A1 | 11/2009 | Srinivasan et al. |
| 2011/0133835 A1 * | 6/2011 | Castaneda et al. ............ 330/197 |

OTHER PUBLICATIONS

Anadigics, "AWT6278R, HELP3™ PCS/WCDMA 3.4 V/29.5 dBm, Linear Power Amplifier Module, Data Sheet—Rev. 2.0," Jan. 2007, pp. 1-8.
U.S. Appl. No. 12/317,819, filed Dec. 30, 2008, Entitled "An Output Gain Stage for a Power Amplifier," by Vishnu Srinivasan, et al.
RF Micro Devices, Inc., "RF2173, 3V GSM Power Amplifier, Package Style: QFN, 16-Pin, 4× 4," 2006, pp. 1-14.
RF Micro Devices, Inc., "What's Next in UMTS Front-Ends," 2007, pp. 1-2.

* cited by examiner

*Primary Examiner* — Nguyen Vo
(74) *Attorney, Agent, or Firm* — Trop, Pruner & Hu, P.C.

(57) ABSTRACT

In one embodiment, a power amplifier may include an output stage with multiple transformers and corresponding matching capacitances. The capacitances may include a first matching capacitance coupled in parallel with a secondary coil of a first transformer and a second matching capacitance coupled in parallel with a secondary coil of a second transformer, where the secondary coils are coupled in series in an output stack configuration. By accounting for parasitics present in the power amplifier, the first matching capacitance can be designed to have a greater capacitance than the second matching capacitor, even where the first and second transformers are configured to output substantially equal power levels.

23 Claims, 4 Drawing Sheets

REDUCING COMMON MODE EFFECTS IN AN OUTPUT STAGE

BACKGROUND

In certain power amplifiers (PAs) and other circuitry, an output stage or network may combine powers from multiple gain stages in order to obtain a single power output. One or more transformers can be used to magnetically combine the output powers to be provided to a load, e.g., an antenna. For many reasons, the amount of power lost in the transformer should be minimized. To reduce power dissipation in such a structure, oftentimes the transformer can be tuned using capacitors coupled to the transformer, namely matching capacitors provided at the input and the output of the transformer. In addition to intentional capacitances added into a circuit, parasitic capacitances may also be present due to various capacitances inherent in an integrated circuit (IC). For example, a transformer can be formed of windings formed on different layers of a semiconductor die. There can be parasitic capacitance in between these winding layers. Such parasitic capacitance can impact the operation of the transformer.

One example of a simple output network is a transformer having a primary coil (L1) coupled to an output of a gain stage (e.g., a differential output) and that is magnetically coupled to a secondary coil (L2) that in turn is electrically coupled to an output load, e.g., an antenna. In order to maximize the power transfer to the load, the transformer may be bi-conjugately matched. This matching can be realized via parallel capacitors coupled in parallel to both the primary coil and the secondary coil. Methods of calculating the values of such capacitances can be accomplished using well known techniques, e.g., performing an LC calculation between the inductance and capacitance, based on a desired frequency of operation. However, in addition to these intentional capacitances, parasitic capacitances may be present, causing the transformer to respond to common mode voltages, which causes the resulting circuit to vary from the designed intentional capacitor values, causing power dissipation and possibly variations in tuning.

SUMMARY OF THE INVENTION

According to one aspect, a power amplifier (PA) includes multiple transformers to output a radio frequency (RF) signal to an output load. In one implementation, the PA may include a first transformer having a first coil to receive a first amplified signal from a first gain stage and a second coil to output the first amplified signal to the output load and a second transformer having a third coil to receive a second amplified signal from a second gain stage and a fourth coil to output the second amplified signal to the output load. The second coil can be coupled in series to the fourth coil at an inter-transformer node, or additional coils of other transformers may be coupled in series between the second and fourth coils.

To enable transmission at a desired frequency, a first matching capacitance can be coupled in parallel with the second coil and a second matching capacitance coupled in parallel with the fourth coil. By accounting for parasitics present in the PA, the first matching capacitance can be designed to have a greater capacitance than the second matching capacitor, even where the first and second transformers are configured to output substantially equal power levels. In addition, the first matching capacitance can be set at a value less than a matching capacitance value for the first matching capacitance, to reduce common mode effects. This lesser value may be by a value of a parasitic capacitance present between the first and second coils.

In addition to output matching capacitances, input matching capacitances may be present. In one implementation, a third matching capacitance can be coupled in parallel with a positive terminal of the first coil and a fourth matching capacitance coupled in parallel with a positive terminal of the third coil, where the third matching capacitance is greater than the fourth matching capacitance. The input matching capacitances may further include a fifth matching capacitance coupled in parallel with a negative terminal of the first coil and a sixth matching capacitance coupled in parallel with a negative terminal of the third coil, where the fifth matching capacitance is less than the sixth matching capacitance.

Another aspect of the present invention is directed to an output network for a power amplifier including multiple transformers and matching capacitances. In one implementation, the output network may include a first transformer having a first coil to receive a first differential amplified signal from a first gain stage and a second coil coupled to an output pad and a second transformer having a third coil to receive a second amplified signal from a second gain stage and a fourth coil to couple to a reference voltage. The second coil can be coupled in series to the fourth coil at an inter-transformer node and the first and second transformers can output a single-ended signal via the output pad. A first matching capacitance can be coupled in parallel with the second coil, where the first matching capacitance has a capacitance less than a calculated matching capacitance by a parasitic capacitance present in the output network that is associated with the first transformer. A second matching capacitance can be coupled in parallel with the fourth coil, where the second matching capacitance has a capacitance less than a calculated matching capacitance by a parasitic capacitance present in the output network that is associated with the second transformer. In different implementations, the second transformer can have an equal or different turns ratio than the first transformer, depending on whether the gain stages are of equal powers. In an implementation where the first and second transformers are configured to output substantially equal power levels, the second matching capacitance may be less than the first matching capacitance.

Yet another aspect of the present invention is directed to a system that includes a baseband processor, a transceiver coupled to the baseband processor to receive baseband signal information and to output a RF signal, and an amplifier to amplify the RF signal to output an amplified RF signal to an output load. The amplifier may include gain stages each to output a differential amplified RF signal and an output stage to receive the amplified RF signals for output as a single-ended RF signal to the output load. The output stage may include transformers and input and output matching capacitors such as described above.

DETAILED DESCRIPTION

In various embodiments, one or more transformers of an output stage can have tuning capacitances provided for them that seek to neutralize common mode effects. This is particularly so in various implementations in which multiple transformers have independent inputs but series-combined outputs. That is, to power combine outputs of different gain stages, multiple transformers may be present, each having an independent primary coil and a secondary coil that is coupled in series to the secondary coils of one or more other transformers. As one example, for a two transformer version, each transformer may have an independent primary coil but have a secondary coil that is combined in series. In this way, when a given amount of power is driven into the two primaries, the combined secondary will combine the power at the output. Embodiments may apply to other transformer implementations such as a single multi-tap transformer having multiple gain stages coupled to different taps of a primary coil.

Figure 1:
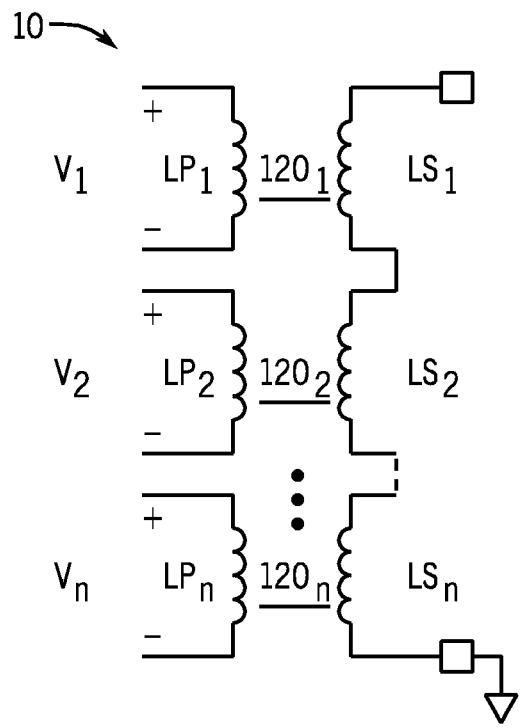
FIG. 1 is a schematic diagram of a transformer-based output stage in accordance with an embodiment of the present invention.

Referring now to FIG. 1, shown is a schematic diagram of a transformer-based output stage in accordance with an embodiment of the present invention. As shown in FIG. 1, output stage 10 includes multiple transformers namely transformers 120a-120n. As seen, each transformer has an independent primary coil $LP_1$-$LP_n$ and a secondary coil. $LS_1$-$LS_n$ that is coupled in series to at least one other secondary coil. Thus as seen, output stage 10 has n differential inputs and a single differential output. For some implementations, one side of the differential output can be connected to a ground or other reference voltage, as shown in FIG. 1, essentially enabling the transformer structure to be a balun. In this way, transformer 10 will only behave differentially if there is no intercoil capacitance. However, in typical semiconductor technology this is not the case, as these various coils will suffer from some amount of parasitic capacitance, due to their being formed in generally similar locations of a semiconductor die and on closely located layers. As such there are both common mode and differential signals. In an embodiment in which the transformers are fabricated on a single semiconductor die, the layers that form the transformer can be close together, causing a parasitic capacitance across the coils. When a differential signal is driven into the transformers, some current flows through these parasitic capacitances, causing a power loss such that the output signal is attenuated. In various embodiments, a determination of the parasitic capacitance can be made during design of the integrated circuit, and the designed intentional matching capacitances can account for the parasitics, thus neutralizing or at least reducing the common mode effects.

Accordingly, to overcome these common mode effects that can impact power dissipation and tuning, embodiments may provide for a transformer structure having intentional capacitances that vary from their nominal designed matching values to thus account for these parasitic capacitances. In this way, the actual structure of the capacitances for different transformer coils can be of different sizes, even where the corresponding transformers are of the same size and even configured to provide the same output power, to thus reduce common mode effects.

Figure 2:
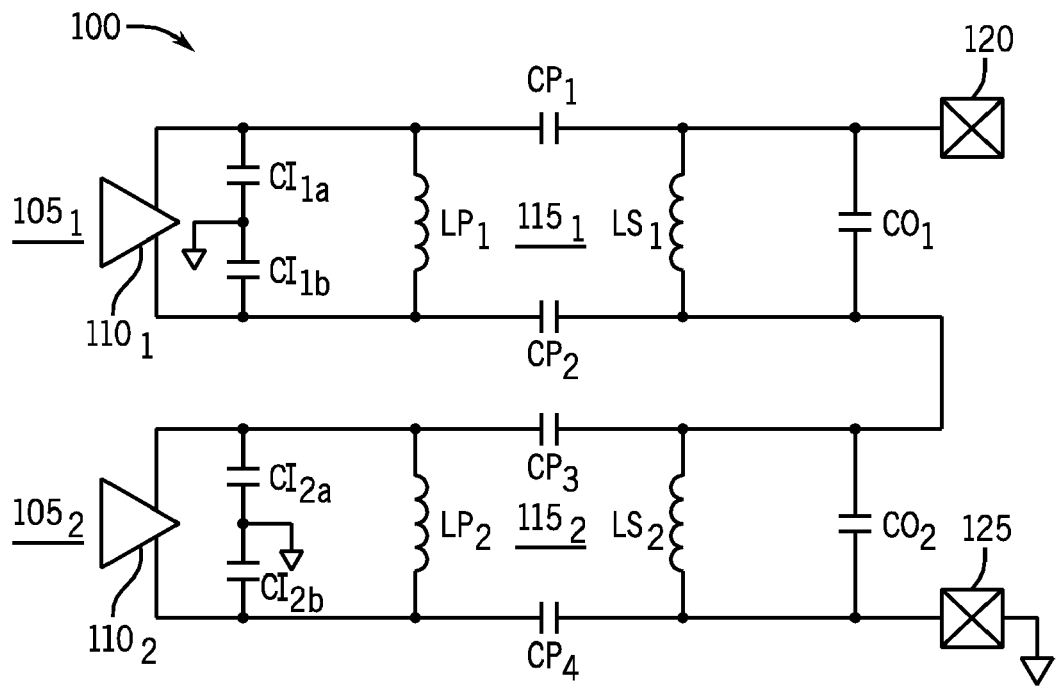
FIG. 2 is a schematic diagram of an output stage having two transformers with independent primaries and series-combined secondaries in accordance with one embodiment of the present invention.

Referring now to FIG. 2, shown is a schematic diagram of an output stage 100 having two transformers $115_1$ and $115_2$ with independent primaries and series-combined secondaries. Each transformer is part of a path or slice for power output from a corresponding gain stage 110 to be transmitted from output stage 100. Note that while shown with only two such transformers for ease of discussion, in various implementations many more transformers may be coupled together, with independent primaries each coupled to receive an output of a gain stage and having series-connected secondaries. As one such example, three transformers may be present, with one gain stage configured to provide half the output power, and the other two gain stages configured to each provide a quarter of the output power.

As seen in FIG. 2, each gain stage 110 may have a differential output coupled to a corresponding primary coil $LP_1$ and $LP_2$ of one of corresponding transformers 115. Each gain stage may be formed of one or more transconductance amplifiers. In one embodiment, gain stages 110 are complementary metal oxide semiconductor (CMOS) stages each including a pair of complementary metal oxide semiconductor field effect transistors (MOSFETs), namely a p-channel MOSFET (PMOS) and an n-channel MOSFET (NMOS). The gain stages may have differential outputs coupled to a primary coil of a corresponding transformer $115_{1-2}$ (generically transformer 115). The primary coils of transformers 115 are magnetically coupled to corresponding secondary coils $LS_1$ and $LS_2$, which in turn are coupled together in series and further, the series stack is coupled to output pads 120 and 125. In a single-ended output implementation, first output pad 120 is coupled to a load such as a single-ended antenna, and second output pad 125 is coupled to a ground voltage.

While the transformers may be sized substantially the same in some implementations, in other embodiments differently sized transformers (e.g., via differential turns ratios) and differently sized gain stages may be present. Depending upon a mode of operation, e.g., a high power mode or low power mode, one or more of gain stages 110 may be inactive. Unused gain stages can be forced to be in a high impedance (Hi-Z) or a low impedance (Lo-Z) mode. In different implementations primaries can be strongly coupled to each other or not. If the primaries are strongly coupled, the unused amplifiers can be placed in a Hi-Z state. If there are different turns ratios, then some unused gain stages (with low turns ratio transformers at their output) will see large voltages when in Hi-Z state. In other embodiments, the transformer can be weakly magnetically coupled, or not coupled at all. As used herein, with such weakly coupled primaries, the unused gain stage may be placed in a Lo-Z state. In such a case, the Lo-Z state the high voltages may be eliminated, while not causing high signal losses. The primaries can be each made with a center tap, allowing independent control of bias voltages for each gain stage.

As seen, capacitors to enable proper matching may be provided at the inputs and outputs of the transformers. Namely first path $105_1$ includes a pair of input capacitances $CI_{1a}$ and $CI_{1b}$, each of which may be coupled between a corresponding terminal of primary coil $L_P$, and a ground voltage. First path 105 further includes an output capacitor $C0_1$. Similar capacitances may be present with regard to second path $105_2$, including input capacitances $CI_{2a}$ and $CI_{2b}$ and an output capacitor $CO_2$. As will be described further, the size of the capacitances as the stack is traversed will vary. While the scope of the present invention is not limited in this regard, in some implementations the input and output capacitances may vary from a maximum capacitance size at a top of the stack (i.e., transformer $115_1$ and capacitances $CI_{1a}$ and $CI_{1b}$ and $CO_1$) to a minimum capacitance size at the stack bottom (e.g., transformer $115_2$ and capacitances $CI_{2a}$ and $CI_{2b}$ and $CO_2$) the difference in capacitance between the different levels of the stack may vary depending on parasitics. As further seen, parasitic capacitances may inhere between the coils of the transformers. These parasitic capacitances can be modeled as capacitances $CP_1$-$CP_4$. Using an analysis in accordance with an embodiment of the present invention, the response of these parasitic capacitances can be determined during design, and the actual values designed for the matching capacitors $CI_{1-2}$ and $CO_{1-2}$ may be adjusted from their predetermined matching values.

To begin the analysis, the transformers may be analyzed independently with differential and common mode responses. Thus a first pass may be made by ignoring the differential response. In this pass, because the inputs are purely differential, they can be grounded, as only at the common mode response is of interest. The common mode voltage is between any point on the secondary coil and acts as a common mode voltage over to the primary because it is not purely differential.

Figure 3:
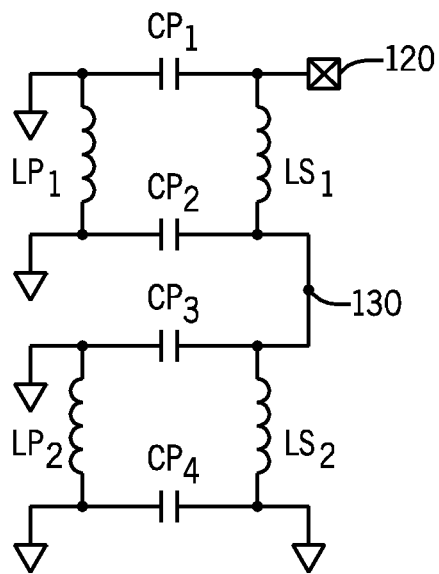
FIG. 3 is a schematic diagram of the output stage of FIG. 2 as modeled during a common mode analysis in accordance with an embodiment of the present invention.

Because there is no common mode response, the inputs can be grounded. Referring now to FIG. 3, shown is a schematic diagram of the output stage of FIG. 2 as modeled during a common mode analysis in accordance with an embodiment of the present invention. As seen in FIG. 3, the inputs from gain stages 110 may be grounded and similarly, input matching capacitors can be ignored. Furthermore, the outputs from gain stages 110 may be grounded and similarly, output matching capacitors can be ignored. Assume for purposes of the analysis that the transformers $115_1$ and $115_2$ may be equally sized and equally configured to output substantially the same power levels. Further, for purposes of discussion, assume the output voltage at output node 120 is two volts. As the transformers are assumed to drive equal amounts of power, an inter-transformer node 130 may be at one volt. Then voltages across the capacitances may be determined. This means that the common mode voltage on nodes 120 and 130 is 1.5 volts. Therefore capacitors $CP_1$ and $CP_2$ will both see a voltage of 1.5 V across them. Using similar reasoning capacitors, $CP_3$ and $CP_4$ will see 0.5 volts across them.

Figure 4:
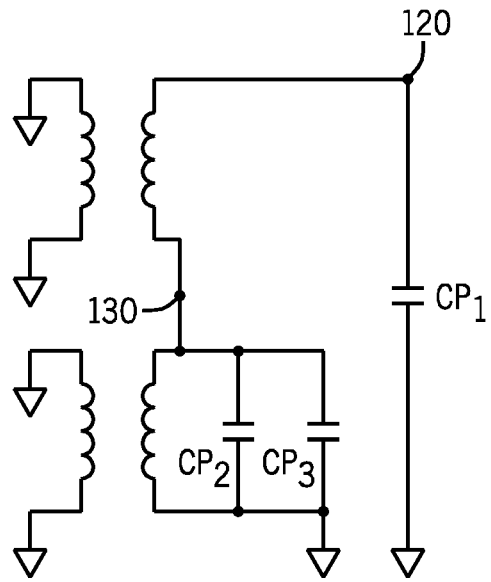
FIG. 4 is an equivalent schematic diagram of the output stage of FIG. 3 as modeled during a common mode analysis in accordance with an embodiment of the present invention.
Figure 5:
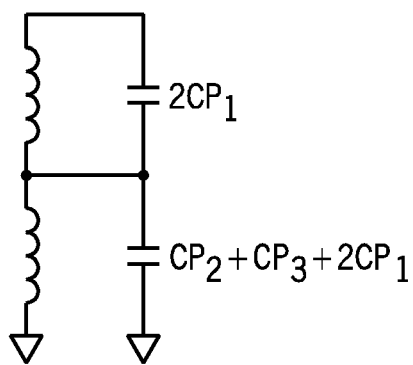
FIG. 5 is an equivalent diagram for the transformer secondaries of FIG. 4 as modeled during further analysis in accordance with an embodiment of the present invention.

Referring now to FIG. 4, shown is an equivalent schematic diagram for that of FIG. 3. In this part of the analysis, assuming that the input common mode voltage is zero, parasitic capacitances can be moved to the secondary side, resulting in the FIG. 4 diagram. Thus as seen, capacitance $CP_1$ may be coupled between the output node 120 and ground, while capacitances $CP_2$ and $CP_3$ may each be coupled in parallel between inter-transformer node 130 and ground. Thus in general, capacitances $CP_2$ and $CP_3$ can be merged into a single capacitance. Similarly, with regard to capacitance $CP_1$, it is noted that this capacitance may be split into two series capacitances such that parasitic capacitances of equal value ($CP_1/2$) may couple between the output node and inter-transformer node 130 and ground, respectively. Thus FIG. 5 shows the equivalent schematic to FIG. 4.

The differential part of the analysis may be performed by taking the amount of capacitance needed to tune the transformer, and subtracting the common mode parasitic capacitance. As an example, the determined parasitics may be subtracted from the matching capacitors as follows: ($CO_1$=$CO_1$-$2(CP_1)$) and ($CO_2$=$CO_2$-$CP2$-$CP_3$-$2CP_1$). Thus in various embodiments, the resulting intentional capacitor values may be less than the matching capacitor values, namely less by the determined amount of parasitics. As such, the transformer structure is formed using capacitor values that are different than matching values for the capacitors to account for common mode effects. In general, the matching values for the intentional capacitors may generally correspond to a tuning value of an LC combination for a desired frequency, where L is the inductance of the corresponding transformer coil and C is the matching capacitance. The final analysis provides an equivalent amount of capacitance across each secondary coil corresponding to the parasitics, which can be subtracted away from the intentional tuning capacitance to obtain a final value.

This analysis may proceed in this manner no matter how many transformers are stacked together. This first-order analysis may be sufficient for practical implementations. In many designs, the capacitance will become larger as the stack is traversed, e.g., from bottom to top, resulting in a stack of transformers with a larger matching capacitance at the top and progressively getting smaller as the stack traverses to the bottom.

Figure 6A:
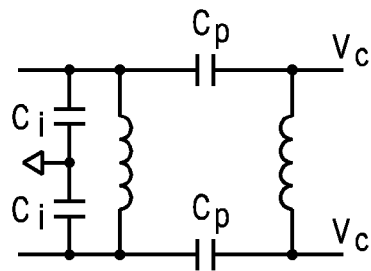
FIGS. 6A and 6B are a portion of a schematic diagram of an input stage in accordance with one embodiment of the present invention.
Figure 6B:
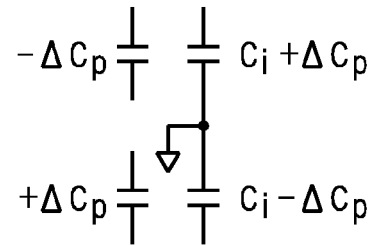

A similar analysis can be performed with regard to the input capacitances, as some amount of the parasitic capacitances due to common mode effects can transfer to the input side. Referring now to FIG. 6A, shown is a portion of a schematic diagram of an input stage including the matching capacitances, which can be modeled as a pair of matching capacitances CI. As seen, parasitic capacitances $C_P$ represent a parasitic capacitance between the primary coil and secondary coil. To perform an analysis in accordance with an embodiment of the present invention, this parasitic capacitance can be modeled as capacitances in parallel with the input capacitances, namely a negative capacitance and a positive capacitance. The negative and positive capacitances arise because the top parasitic capacitor provides additional current to the top input node for a positive voltage on that node, which gives a negative capacitance. Similarly the bottom parasitic capacitor provides additional current to the input node, but for a negative voltage on the bottom input node which is equivalent to a positive capacitance. Thus as seen in FIG. 6B, the resulting matching capacitances may differ from the determined matching capacitance values by this $\Delta C$ value. Namely the matching capacitance to be coupled to a positive input node of the primary coil may be $CI+\Delta CP$, while the matching capacitance to be coupled to a negative input node of the primary coil may have a value of $CI-\Delta CP$. Note that this analysis is for the top path, e.g., path 105, of FIG. 2. A similar analysis can be performed for the lower stack, and which may result in input matching capacitors with different values. For example, the input matching capacitance coupled to the positive input terminal may have a smaller value from the corresponding top stack, and the input matching capacitance coupled to the negative input terminal may have a larger value than the corresponding top stack capacitance.

Figure 7:
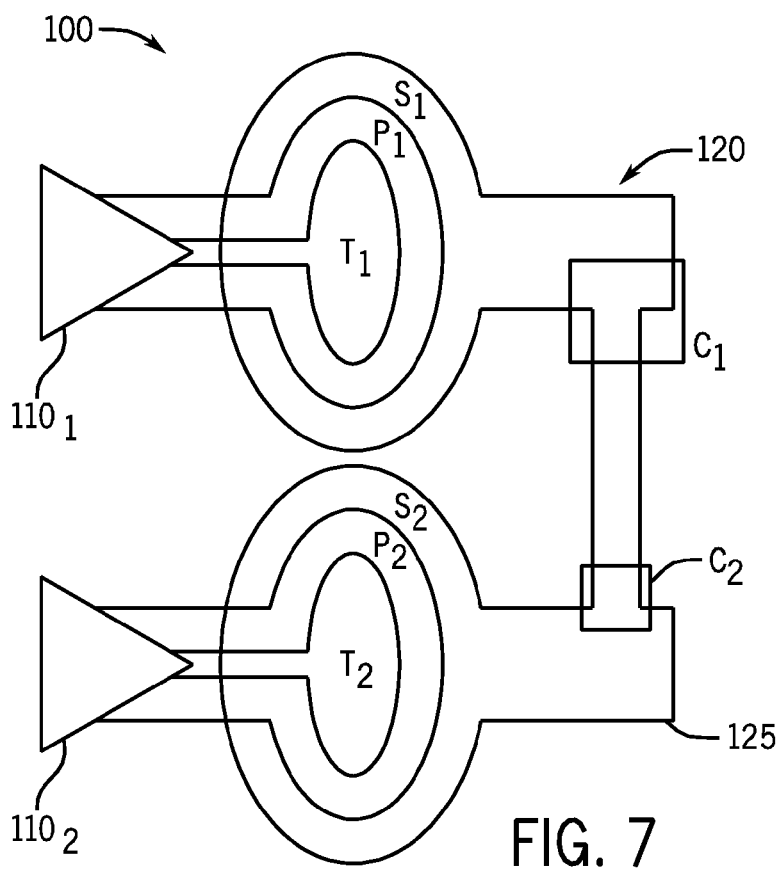
FIG. 7 is an example layout of an output stage of a semiconductor die in accordance with an embodiment of the present invention.

Referring now to FIG. 7, shown is an example layout of an output stage of a semiconductor die in accordance with an embodiment of the present invention. As shown in FIG. 7, output stage 100 may generally correspond to that shown in FIG. 2. As seen, a pair of gain stages $110_1$ and $110_2$ are coupled to corresponding transformers T1 and T2, each formed of a respective primary coil (P) and secondary coil (S). This differential circuit may be provided with a single ended output pad 120, as the other pad 125 may be grounded. To neutralize common mode effects in this implementation, note that the matching capacitors associated with the secondary sides of the transformers may be of different sizes, i.e., having different capacitance values and therefore of different sizes and consume different real estate amounts on the die. As seen, capacitor C1 corresponding to the output matching capacitor for transformer T1 is larger than capacitor C2, owing to its higher position in the stack. If additional stages were present, understand that such stages may have even smaller capacitors associated with them. The determination of the values for these capacitors may be performed in accordance with an embodiment of the present invention. While not shown for ease of illustration in FIG. 7, understand that input capacitances may be coupled across the corresponding primary coils.

Note that FIG. 7 shows a generally top view of a semiconductor die, and that the different structures shown may be adapted on multiple layers of the die. For example, the capacitors may be formed by finger capacitors that are implemented in a number of layers of the semiconductor die. In one example implementation, the capacitors may be metal-insulator-metal finger capacitors formed of a stack of metal layers, e.g., metal layers 1-5 (M1-M5), where the primaries of the transformers may be formed on a next adjacent metal layer (e.g., M6) and the secondaries formed on the next adjacent metal layer (e.g., M7), and finally the output pads may be formed on a highest metal layer (e.g., M8), although the scope of the present invention is not limited in this regard.

Figure 8:
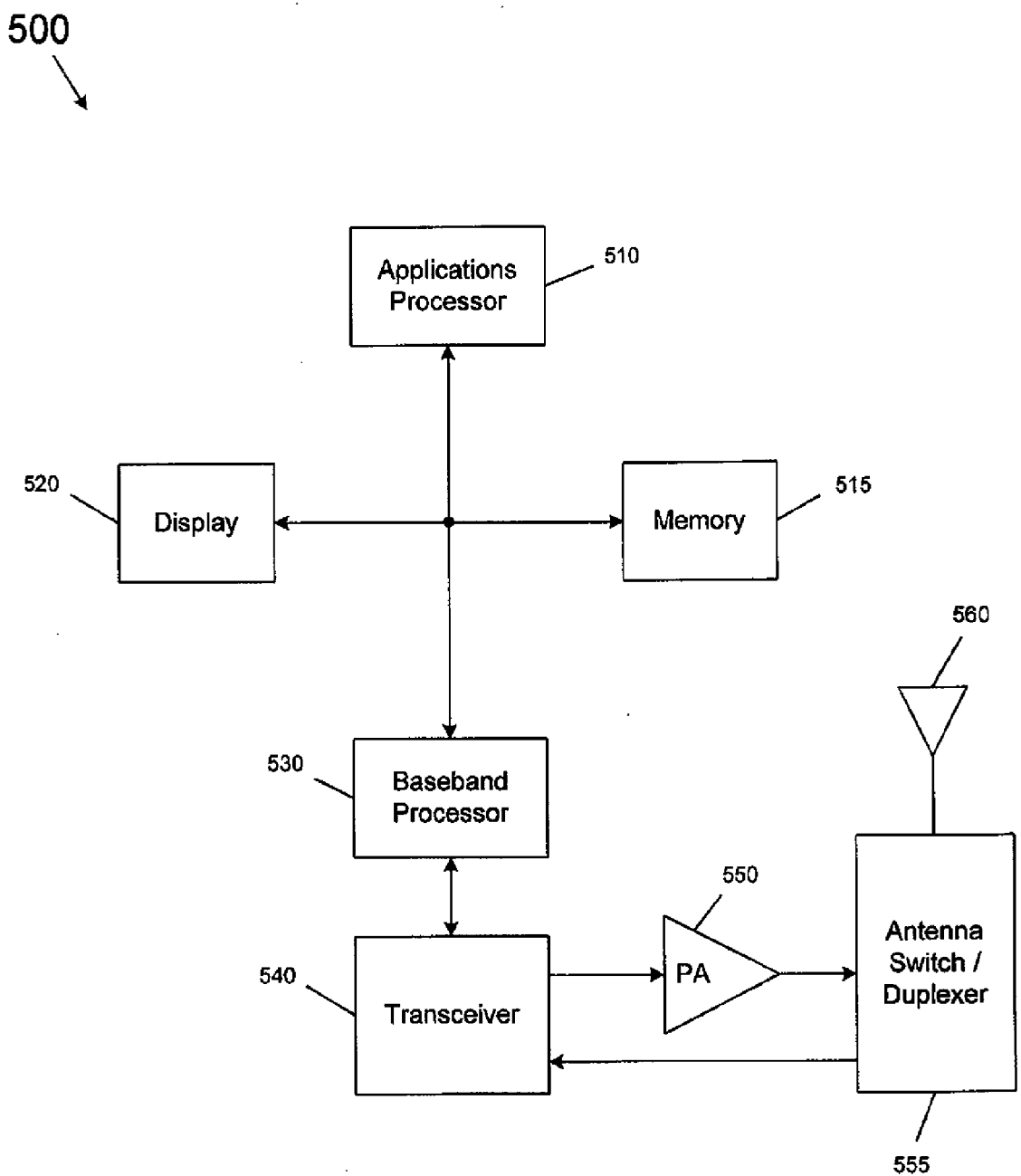
FIG. 8 is a block diagram of a wireless device in accordance with an embodiment of the present invention.

As described above, an output stage including matching capacitances in accordance with an embodiment of the present invention can be implemented in a PA such as a CMOS PA. Such a device can be used in various wireless systems, including handsets, mobile devices, PDAs and so forth. Referring now to FIG. 8, shown is a block diagram of a wireless device 500 in accordance with an embodiment of the present invention, and which may be a 2G, 2.5G, 3G or 4G smart phone, for example. As shown in FIG. 8, wireless device 500 may include an applications processor 510 which may be a microprocessor or other programmable logic to handle various system features, such as running application programs desired by a user. To perform its functions, applications processor 510 may communicate with a memory 515, which may be a flash memory or other non-volatile memory. Applications processor 510 may further communicate with a display 520, such as an LCD display of the system. For handling RF communications, e.g., wireless phone calls, wireless data transmissions and so forth, e.g., according to a W-CDMA, OFDMA, or other protocol, applications processor 510 may communicate with a baseband processor 530, which may handle baseband operations both for transmit and receive paths. In turn, baseband processor 530 is coupled to a transceiver, which may receive incoming baseband signals from baseband processor 530, and perform processing to upconvert the signals to RF levels for transmission to a PA 550, and also instruct the PA regarding an output power level to be applied to the signals. PA 550 may be a power amplifier in accordance with an embodiment of the present invention that includes intentional matching capacitances of different sizes coupled to the primary and secondary coils of an output network of the PA that are designed to reduce common mode effects. In turn, PA 550 may be coupled to an antenna switch, duplexer or both 555 which in turn is coupled to an antenna 560, which radiates the amplified RF signal.

In a receive path, antenna 560 couples through antenna switch 555 and possibly through the duplexer or SAW filters and then to transceiver 540, which may demodulate the incoming RF signals back to baseband for transmission to baseband processor 530 for further processing. While shown with this particular implementation in the embodiment of FIG. 8, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A power amplifier comprising:
a first transformer having a first coil to receive a first amplified signal from a first gain stage and a second coil to output the first amplified signal to an output load;
a second transformer having a third coil to receive a second amplified signal from a second gain stage and a fourth coil to output the second amplified signal to the output load, wherein the second coil is coupled in series to the fourth coil at an inter-transformer node;
a first matching capacitance coupled in parallel with the second coil; and
a second matching capacitance coupled in parallel with the fourth coil, wherein the first matching capacitance has a greater capacitance than a capacitance of the second matching capacitance, the first and second transformers configured to output substantially equal power levels.

2. The power amplifier of claim 1, wherein a first terminal of the second coil is coupled to an output pad, a second terminal of the second coil is coupled to a first terminal of the fourth coil at the inter-transformer node, and a second terminal of the fourth coil is to couple to a ground voltage.

3. The power amplifier of claim 2, wherein the first gain stage includes a first pair of amplifiers to receive a first input signal and to output the first amplified signal, and the second gain stage includes a second pair of amplifiers to receive a second input signal and to output the second amplified signal, the first and second amplified signals being differential signals and to be output via the output pad as a single-ended signal.

4. The power amplifier of claim 3, wherein the first and second transformers are to power combine the first and second amplified signals.

5. The power amplifier of claim 1, wherein the first matching capacitance is less than a matching capacitance value for the first matching capacitance, to reduce common mode effects.

6. The power amplifier of claim 5, wherein the first matching capacitance is less than the matching capacitance value by a value of a parasitic capacitance present between the first coil and the second coil.

7. The power amplifier of claim 1, wherein the first and second matching capacitances comprise finger capacitors formed on a first set of metal layers of a semiconductor die.

8. The power amplifier of claim 7, wherein the first coil and the third coil are formed on a first metal layer adapted over the first set of metal layers.

9. The power amplifier of claim 8, wherein the second coil and the fourth coil are formed on a second metal layer adapted over the first metal layer.

10. The power amplifier of claim 9, wherein the output pad is formed on a third metal layer adapted over the second metal layer.

11. The power amplifier of claim 1, further comprising a third matching capacitance coupled in parallel with a positive terminal of the first coil and a fourth matching capacitance coupled in parallel with a positive terminal of the third coil, wherein a capacitance of the third matching capacitance is greater than a capacitance of the fourth matching capacitance.

12. The power amplifier of claim 11, further comprising a fifth matching capacitance coupled in parallel with a negative terminal of the first coil and a sixth matching capacitance coupled in parallel with the positive terminal of the third coil, wherein a capacitance of the fifth matching capacitance is less than a capacitance of the sixth matching capacitance.

13. The power amplifier of claim 1, further comprising:
a third transformer having a fifth coil to receive a third amplified signal from a third gain stage and a sixth coil coupled in series between the second coil and the fourth coil; and
a third matching capacitance coupled in parallel with the sixth coil, wherein the third matching capacitance has a capacitance less than the first matching capacitance and greater than the second matching capacitance.

14. An output network for a power amplifier comprising:
a first transformer having a first coil to receive a first differential amplified signal from a first gain stage and a second coil coupled to an output pad;
a second transformer having a third coil to receive a second amplified signal from a second gain stage and a fourth coil to couple to a reference voltage, wherein the second coil is coupled in series to the fourth coil at an inter-transformer node and the first and second transformers are to output a single-ended signal via the output pad;
a first matching capacitance coupled in parallel with the second coil, wherein the first matching capacitance has a capacitance less than a calculated matching capacitance for the first matching capacitance by a parasitic capacitance present in the output network and associated with the first transformer; and
a second matching capacitance coupled in parallel with the fourth coil, wherein the second matching capacitance has a capacitance less than a calculated matching capacitance for the second matching capacitance by a parasitic capacitance present in the output network and associated with the second transformer.

15. The output network of claim 14, wherein the second transformer has a different turns ratio than the first transformer and wherein the turns ratio of the first transformer is greater than the turns ratio of the second transformer, wherein the first gain stage is a high power gain stage and the second gain stage is a low power gain stage.

16. The output network of claim 14, wherein the second matching capacitance is less than the first matching capacitance and the first and second transformers are configured to output substantially equal power levels.

17. The output network of claim 14, further comprising:
a third transformer having a fifth coil to receive a third differential amplified signal from a third gain stage and a sixth coil coupled in series between the second coil and the fourth coil; and
a third matching capacitance coupled in parallel with the sixth coil, wherein the third matching capacitance has a capacitance less than a calculated matching capacitance for the third matching capacitance by a parasitic capacitance present in the output network and associated with the third transformer.

18. The output network of claim 17, wherein the third matching capacitance has a capacitance greater than the second matching capacitance and less than the first matching capacitance.

19. A system comprising:
a baseband processor;
a transceiver coupled to the baseband processor to receive baseband signal information therefrom and to output a radio frequency (RF) signal; and
an amplifier to amplify the RF signal to output an amplified RF signal to an output load, the amplifier having a plurality of gain stages each to output a differential amplified RF signal and an output stage to receive each of the differential amplified RF signals and to output the amplified RF signal as a single-ended RF signal to the output load, the output stage including a first transformer having a first coil to receive a first differential amplified RF signal from a first gain stage and a second coil, a second transformer having a third coil to receive a second differential amplified RF signal from a second gain stage and a fourth coil, wherein the second coil is coupled in series to the fourth coil at an inter-transformer node and the second and fourth coils are to output at least a portion of the amplified RF signal, a first matching capacitor coupled in parallel with the second coil, and a second matching capacitor coupled in parallel with the fourth coil, wherein the first and second matching capacitors have a smaller capacitance than a calculated matching capacitance for the corresponding matching capacitor.

20. The system of claim 19, wherein the first matching capacitor is less than the calculated matching capacitance by a value of a parasitic capacitance present between the first coil and the second coil.

21. The system of claim 19, wherein the first and second matching capacitors comprise finger capacitors formed on a first set of metal layers of a semiconductor die.

22. The system of claim 21, wherein the first matching capacitor consumes a greater area on the first set of metal layers than the second matching capacitor.

23. The system of claim 21, wherein the first and third coils are formed on a first metal layer adapted over the first set of metal layers, the second and fourth coils are formed on a second metal layer adapted over the first metal layer, and an output pad coupled to the second coil and to couple to the output load is formed on a third metal layer adapted over the second metal layer.

* * * * *